(12) United States Patent
Park (10) Patent No.: US 9,260,289 B2
(45) Date of Patent: Feb. 16, 2016

(54) OPTICAL-MICROWAVE-QUANTUM TRANSDUCER

(71) Applicant: Jae I. Park, Boulder, CO (US)

(72) Inventor: Jae I. Park, Boulder, CO (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 245 days.

(21) Appl. No.: 14/016,699

(22) Filed: Sep. 3, 2013

(65) Prior Publication Data

US 2015/0060756 A1 Mar. 5, 2015

(51) Int. Cl.
*B81B 3/00* (2006.01)
*H01L 29/06* (2006.01)
*B81B 7/00* (2006.01)
*G02B 6/00* (2006.01)
*B82Y 20/00* (2011.01)

(52) U.S. Cl.
CPC .............. *B81B 3/0029* (2013.01); *B81B 3/0021* (2013.01); *B81B 7/0093* (2013.01); *B82Y 20/00* (2013.01); *G02B 6/00* (2013.01); *B81B 2201/0292* (2013.01); *B81B 2201/047* (2013.01)

(58) Field of Classification Search
None
See application file for complete search history.

(56) References Cited

U.S. PATENT DOCUMENTS

| 6,815,708 | B1* | 11/2004 | Iguchi et al. ............. 257/33 |
| 7,630,588 | B2* | 12/2009 | Ouchi ............. G01N 21/3581 250/216 |
| 7,689,070 | B2* | 3/2010 | Ouchi ............. G01N 21/3581 250/216 |
| 7,889,992 | B1* | 2/2011 | DiVincenzo et al. ......... 398/115 |
| 8,670,807 | B2* | 3/2014 | Rose et al. .................... 505/170 |
| 8,849,075 | B2* | 9/2014 | Painter et al. .................... 385/14 |
| 2006/0085160 | A1* | 4/2006 | Ouchi ............. G01N 21/3581 702/150 |
| 2008/0304038 | A1* | 12/2008 | Ouchi ............. G01N 21/3581 356/3 |
| 2009/0075825 | A1* | 3/2009 | Rose et al. .................... 505/170 |
| 2013/0121633 | A1* | 5/2013 | Painter et al. .................... 385/14 |

(Continued)

FOREIGN PATENT DOCUMENTS

| EP | 1 213 774 B1 | 12/2010 |
| WO | WO 2009/023969 A1 | 2/2009 |
| WO | WO 2011/032825 A1 | 3/2011 |

OTHER PUBLICATIONS

CST AG Nanophotonics and integrated optics, "Photonic Crystal Cavities" (2013).*

(Continued)

*Primary Examiner* — Andrew Jordan
(74) *Attorney, Agent, or Firm* — Tarolli, Sundheim, Covell & Tummino LLP (57) ABSTRACT

An optical-microwave-quantum transducer can include a tapered optical fiber configured to transmit and receive optical signals. The optical-microwave-quantum transducer can also include a cantilever that can include an optical cavity that includes a nanophotonic crystal. The optical cavity can be configured to provide mechanical excitation in response to electromagnetic excitation induced by photons emitted from the tapered optical fiber. The cantilever can also include a mechanical coupler that is configured to induce electrical modulation onto a superconducting cavity in response to the mechanical excitation. The mechanical coupler can also be configured to provide mechanical excitation in response to electromagnetic excitation induced by photons from the superconducting cavity. The optical cavity can further be configured to provide electromagnetic excitation that induces optical modulation on the tapered optical fiber in response to the mechanical excitation.

21 Claims, 6 Drawing Sheets

(56) References Cited

U.S. PATENT DOCUMENTS

2015/0060650 A1* 3/2015 Park .......................... 250/214.1
2015/0060756 A1* 3/2015 Park .................................. 257/9

OTHER PUBLICATIONS

Bochmann et al., "Nanomechanical Coupling Between Microwave and Optical Photons", Nature Physics, vol. 9, No. 11, Sep. 15, 2013, pp. 712-716.*
Google search results on "optical cavity nanophotonic crystal" Sep. 29, 2015.*
Painter, "Optomechanical Crystals and Their Quantum Optical Applications", Photonics Conference (IPC), 2012 IEEE, Sep. 23, 2013, p. 546.
Mukhanov et al., "Development of Energy-Efficient Cryogenic Optical (ECO) Data Link", 2013 IEEE 14th International Superconductive Electronics Conference (ISEC), Jul. 7, 2013, pp. 1-3.
Cicak et al., "Vacuum-Gap Capacitors for Low-Loss Superconducting Resonant Circuits", IEEE Transactions on Applied Superconductivity, IEEE Service Center, Los Alamitos, CA, US, vol. 19, No. 3, Jun. 1, 2009, pp. 948-952.
Sun et al., "A Superhigh-Frequency Optoelectromechanical System Based on a Slotted Photonic Crystal Cavity", Applied Physics Letters, American Institute of Physics, US, vol. 101, No. 22, Nov. 26, 2012, pp. 221116-1-221116-5.
Winger et al., "A Chip-Scale Integrated Cavity-Electro-Optomechanics Platform", Optics Express, vol. 19, No. 25, Nov. 22, 2011, pp. 24905-24921.
International Search Report for PCT/US2014/052906, pp. 1-4.
Aoki, et al.: "*Observation of Strong Coupling Between One Atom and a Monolithic Microresonator*", Norman Bridge Laboratory of Physics 12-33, California Institute of Technology, Pasadena, CA 91125, USA, Sep. 4, 2006, pp. 1-12.
Dicarlo, et al.: "*Demonstration of Two-Qubit Algorithms with a Superconducting Quantum Processor*", Departments of Physics and Applied Physics, Yale University, New Haven, CT 06511, USA, May 1, 2009, pp. 1-6 & Supplemental Material pp. 1-3.
Eichenfield, et al.: "*Optomechanical Crystals*", California Institute of Technology, Pasadena, CA 91125, USA, Jun. 6, 2009, pp. 1-16.
Hossein-Zadeh, et al.: "*An Optomechanical Oscillator on a Silicon Chip*", IEEE Journal of Selected Topics in Quantum Electronics, vol. 16, No. 1, Jan./Feb. 2010, pp. 276-287.
Kimble: "*The Quantum Internet*", Norman Bridge Laboratory of Physics 12-33, Jun. 25, 2006, pp. 1-15.
Lin, et al.: "*Coherent Mixing of Mechanical Excitations in Nano-Optomechanical Structures*", Laboratory of Applied Physics, California Institute of Technology, Pasadena, CA 91125, USA, Aug. 7, 2009, pp. 1-27.
O'Connell, et al.: "*Quantum Ground State and Single-Phonon Control of a Mechanical Resonator*", Nature, Articles, vol. 464, Apr. 1, 2010, pp. 697-703.
Regal, et al.: "*From Cavity Electromechanics to Cavity Optomechanics*", $22^{nd}$ International Conference on Atomic Physics, Journal of Physics: Conference Series 264 (2011) 012025, pp. 1-8.
Safavi-Naeini, et al.: "*Proposal for an Optomechanical Traveling Wave Phonon-Photon Translator*", New Journal of Physics 13 (2011) 013017 (30pp), Received Oct. 1, 2010, Published Jan. 13, 2011, Online at http://www.nip.org, pp. 1-30.
Sillanpää, et al.: "*Coherent Quantum State Storage and Transfer Between Two Phase Qubits Via a Resonant Cavity*", National Institute of Standards and Technology, 325 Broadway, Boulder, CO 80305, USA, Sep. 14, 2007, pp. 1-17.
Teufel, et al.: "*Circuit Cavity Electromechanics in the Strong-Coupling Regime*", Letter, Nature, vol. 471, Mar. 10, 2011, pp. 204-208.
Inernational Search Report for related PCT/US2014/065946, completed Mar. 16, 2015 by Yves Verbandt of the EPO.
André, et al.: "*A Coherent All-Electrical Interface Between Polar Molecules and Mesoscopic Superconducting Resonators*"; Nature Physics, vol. 2, No. 9, Aug. 27, 2006, pp. 636-642; XP055174009, ISSN: 1745-2473; DOI: 10.1038/nphys386.
Aspelmeyer, et aL : "*Cavity Optomechanics*"; Rev. Mod. Phys, Mar. 4, 2013, pp. 1391; XP055173816; DOI: 10.1103/R3vModPhys. 86.1391; Retrieved from the Internet: URL: http://arxiv.org/pdf/1303.0733v1.pdf [retrieved on Mar. 4, 2015].
Bochmann, et al.: "*Nanomechanical Coupling Between Microwave and Optical Photons*"; Nature Physics, vol. 9, No. 11, Sep. 15, 2013, pp. 712-716; XP055173152; ISSN: 1745-2473; DOI 10.1038/nphys2748.
Favero, et al.: "*Optomechanics of Deformable Optical Cavities*"; Nature Photonics; vol. 3, No. 4; Apr. 1, 2009; pp. 201-205; XP055173168; ISSN: 1749-4885; DOI: 10.1038/nphoton.2009.42.
Regal, et al.:"*From Cavity Electromechanics to Cavity Optomechanics*"; Journal of Physics: Conference Series, Institute of Physics Publishing, Bristol, GB; vol. 264, No. 1; Jan. 26, 2011; pp. 12025; XP020203271; ISSN: 1742-6596; DOI: 10.1088/1742-6596/264/1/012025.
Stannigel, et al.: "*Opto-Mechanical Transducers for Long-Distance Quantum Communication*"; Jun. 22, 2010; XP055174007; DOI: 10.1103/PhysRevLett.105.220501; Retrieved from the Internet: URL:http://arxiv.org/abst/1006.4361 [retrieved on Mar. 5, 2015].
Sun, et al.: "*A Superhigh-Frequency Optoelectromechanical System Based on a Slotted Photonic Crystal Cavity*"; Applied Physics Letters, American Institute of Physics, US; vol. 101, No. 22; Nov. 26, 2012; pp. 221116-221116; XP012168118; ISSN: 0003-6951; DOI: 10.1063/1.4769045 [retrieved on Nov. 28, 2012].
Tallur, et al.: "*Rayleigh Scattering Boosted Multi-GHz Displacement Sensitivity in Whispering Gallery Opto-Mechanical Resonators*"; Optic Express; Jan. 1, 2013; XP055173860; Retrieved from the Internet: URL:http//arxiv.org/pdf/1309.1481.pdf [retrieved on Mar. 4, 2015].
Tao, et al.: "*A Novel Transducer for Photon Energy Detection Via Near-Field Cavity Optomechanics*"; 2013 Transducers & Eurosensors XXVII: The $17t^{th}$ International Conference on Solid-State Sensors, Actuators and Microsystems (Transducers & Eurosensors XXVIII); IEEE; Jun. 16, 2013; pp. 1511-1514; XP032499433; DOI: 10.1109/Transducers.2013.6627068 [retrieved on Oct. 9, 2013].
Teufel, et al.: "*Prospects for Cooling Nanomechanical Motion by Coupling to a Superconducting Microwave Resonator*"; New Journal of Physics, Institute of Physics Publishing, Bristol, GB; vol. 10, No. 9; Sep. 1, 2008; p. 95002; XP020146258; ISSN: 1367-2630; DOI: 10.1088/1367-2630/10/9/095002.

* cited by examiner

OPTICAL-MICROWAVE-QUANTUM TRANSDUCER

TECHNICAL FIELD

This disclosure relates to an optical-microwave-quantum transducer. More particularly, this disclosure relates to an optical-microwave-quantum transducer with a mechanical coupler.

BACKGROUND

Nanophotonics (or Nano-optics) relates to the behavior of light on the nanometer scale. Nanophotonics is considered as a branch of optical engineering that relates to the interaction of light with particles or substances, at deeply subwavelength length scales. Technologies in the realm of nano-optics include near-field scanning optical microscopy (NSOM), photoassisted scanning tunnelling microscopy, and surface plasmon optics. As industrial communities become more interested in the characterization of materials and phenomena on the scale of a few nanometers, interest in nanophotonics continues to grow.

Superconducting microwave engineering relates to the behavior of electromagnetic excitations at or near GHz frequencies where the wavelength of light typically far exceeds the spatial scale of circuit components. The components of a superconductor circuit are made from superconducting materials and can be operated at near zero resistance. Superconducting engineering shares many similar features as microwave engineering.

Micro-mechanics and nano-mechanics relates to the study of mechanical resonators at the micrometer and nanometer scales. The primary interest is in operation when the mechanical mode frequency is much larger than the damping rate, e.g., a high quality factor. Such a study of mechanical resonators is leading to insights into quantum limited measurement and quantum dynamics at the mesoscale.

SUMMARY

One example relates to an optical-microwave-quantum transducer that includes a tapered optical fiber configured to transmit and receive optical signals. The optical-microwave-quantum transducer can also include a cantilever that can include an optical cavity that includes a nanophotonic crystal. The optical cavity can be configured to provide mechanical excitation in response to electromagnetic excitation induced by photons emitted from the tapered optical fiber. The cantilever can also include a mechanical coupler that is configured to induce electrical modulation onto a superconducting cavity in response to the mechanical excitation. The mechanical coupler can also be configured to provide mechanical excitation in response to electromagnetic excitation induced by photons from the superconducting cavity. The optical cavity can further be configured to provide electromagnetic excitation that induces optical modulation on the tapered optical fiber in response to the mechanical excitation.

Another example relates to an optical-microwave-quantum transducer. The optical-microwave-quantum transducer can include a mechanical coupler that is electrically coupled to a superconducting cavity. The mechanical coupler being configured to mechanically excite in response to an electrical pulse induced by photons emitted from the superconducting cavity. The optical-microwave-quantum transducer can also include an optical cavity having at least two rows of holes formed in a nanophotonic crystal and being mechanically coupled to the mechanical coupler. A given hole in the nanophotonic crystal has an axis that extends through a center of the given hole and intersects with a tapered optical fiber. The optical cavity can be configured to induce optical modulation on the tapered optical fiber in response to the mechanical excitation of the mechanical coupler.

Yet another example relates to a system that includes a refrigeration unit that stores an optical-microwave-quantum transducer at superconducting temperatures. The optical-microwave-quantum transducer can include an optical cavity that includes a nanophotonic crystal. The optical cavity can be configured to provide mechanical excitation in response to electromagnetic excitation induced by photons emitted from an optical fiber. The mechanical coupler can be configured to induce electrical modulation onto a superconducting cavity in response to the mechanical excitation and to provide mechanical excitation in response to electromagnetic excitation induced by photons from the superconducting cavity. The optical cavity can be further configured to provide electromagnetic excitation that induces optical modulation on the optical fiber in response to the mechanical excitation. The system can also include a node configured to transmit and receive optical pulses on an optical channel comprising the optical fiber, wherein the node is external to the refrigeration unit.

DETAILED DESCRIPTION

An optical-microwave-quantum transducer can be configured to convert optical pulses emitted from an optical channel that can include a tapered optical fiber into mechanical energy (e.g., vibrations or shifting) at a mechanical coupler (e.g., a capacitor or a piezoelectric actuator). Moreover, such mechanical energy can cause the mechanical coupler to induce an electrical (quantum) modulation at a superconducting circuit (e.g., a superconducting cavity), thereby converting mechanical energy into electrical energy. In a similar manner, an electrical quantum at the superconducting circuit can be converted into mechanical energy at the mechanical coupler. In response, the mechanical coupler can induce optical modulation onto the tapered optical fiber. In this manner, the superconducting circuit can be stored in a refrigeration unit and communicate via the optical channel with another node.

The optical-microwave-quantum transducer can include an optical cavity with a photonic crystal (e.g., a one or more dimensional photonic crystal cantilever). The photonic crystal can support both an electromagnetic mode (e.g., excitation) and a mechanical mode (e.g., excitation). Coupling between the electromagnetic mode and the mechanical mode can be controlled through incident optical and/or electrical radiation. The optical-microwave-quantum transducer can operate at a single-photon, fully reversible level.

Figure 1:
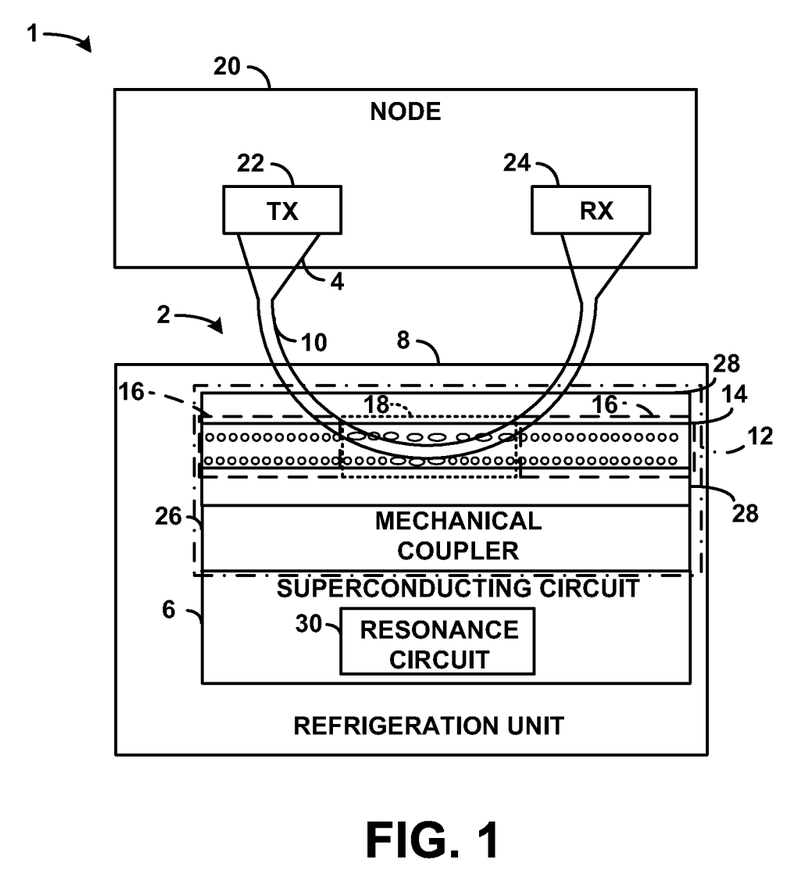
FIG. 1 illustrates an example of a system for transducing optical signals propagating along an optical channel into electrical signals propagated in a superconducting circuit and vice versa.

FIG. 1 illustrates an example of a system 1 that includes an optical-microwave-quantum transducer 2 for transducing optical signals propagating along an optical channel 4 into electrical signals propagated in a superconducting circuit 6 and vice versa. The system 1 can include a refrigeration unit 8 that can house circuit components therein. In some examples, the refrigeration unit 8 can reduce the temperature of the circuit components to a temperature below a critical temperature ($T_c$). The critical temperature for materials that form the circuit components is the temperature at or below which the circuit components achieve superconduction. In some examples, the refrigeration unit 8 can reduce the temperature of the circuit components to between about 10 and about 30 milli-Kelvin (mK).

The optical channel 4 can be formed from an optical fiber. The optical fiber can include a tapered region 10 that can be referred to as a tapered optical fiber 10. To form a tapered optical fiber 10, the optical fiber can be stretched, thereby reducing a cross sectional area of the optical fiber at a given section 10, wherein the tapered portion of the optical fiber can be referred to as the tapered optical fiber 10. The tapered optical fiber 10 can be coupled to a cantilever 12 (e.g. a nanophotonic cantilever).

The cantilever 12 can include a nanophotonic crystal 14 with a photonic lattice. The nanophotonic crystal 14 can be implemented, for example, in a cantilever design that can support mechanical modes (e.g., excitation). The photonic lattice can be formed from a plurality of rows of holes that can be formed (e.g., drilled or etched) into the nanophotonic crystal 14. In some examples, the nanophotonic crystal 14 can have a cross-sectional area, for example of about 200 nanometers (nm) by about 200 nm. In other examples, larger or smaller nanophotonic crystals could be employed. The nanophotonic crystal 14 can be formed, for example, from a material with an index of refraction of about 2, such as silicon nitride ($Si_3N_4$). Each of the holes in the nanophotonic crystal 14 can have a radius of about 10 nm to about 100 nm.

The photonic lattice can have at least one gapped region 16 and an ungapped region 18. In the present example, two gapped regions 16 are illustrated, but there can be more or less gapped regions 16 in other examples. In the gapped region 16, the holes can have a circular shape and have a relatively uniform spacing (e.g., about 10 nm to about 100 nm). In the ungapped region 18, the holes can have a different spacing, different radius, a different shape (e.g., an ellipse) and/or be formed from a different material with a different index of refraction, such as silicon (Si). Taken together, the ungapped region 18 and the at least one gapped region 16 can form an optical cavity.

As noted, the cantilever 12 can be coupled to the tapered optical fiber 10. The tapered optical fiber 10 can provide light transmitted from a transmitter 22 of a node 20 of the system 1, such as a laser or another optical-microwave-quantum transducer. In a similar manner, the tapered optical fiber 10 can receive light at a receiver 24 of the node 20, such as a photodiode or the other optical-microwave-quantum transducer. The transmitter 22 and receiver 24 can be external from the refrigeration unit 8. Accordingly, the transmitter 22 and the receiver 24 do not need to be aligned within the refrigeration unit 8, which can avoid scattering.

In some examples, the tapered optical fiber 10 can be routed through the photonic lattice at a distance to reduce scattering. Alternatively, the tapered optical fiber 10 can be coupled directly to the photonic lattice. In either situation, a given hole in the photonic lattice can have an axis that extends through a center of the given hole and that axis can intersect with the tapered optical fiber 10, such that the tapered optical fiber 10 can overlay (e.g., partially cover) the photonic lattice.

The tapered optical fiber 10 emits more photons than at un-tapered portions of the optical fiber. The photons emitted by the tapered optical fiber 10 can form an evanescent field coupling with the ungapped region 18 of the photonic lattice such that a significant number of the emitted photons (e.g., up to about 97%) can be trapped in the ungapped region 18 of the photonic lattice. Moreover, the gapped region 16 of the photonic lattice can be configured such that relatively few of the emitted photons are trapped within the holes of the gapped region 16.

In some examples, the input and output optical fields can be evanescently coupled between the optical fiber 4 and the cantilever 12 via mode matching at or near proximity to the nanophotonic crystal 14. Accordingly, the optical fiber 4 can run substantially parallel to a surface of the cantilever 12. In other examples, input and output optical fields can be coupled to the nanophotonic crystal 16 by the employment of a cleaved optical fiber that can be remotely attached to a surface of the cantilever 12 and routed to the nanophotonic crystal 14. A cleaved optical fiber can be an optical fiber that has been cut and has a polished end that can be glued flush to a surface of the cantilever 12. In such a situation, light emitted from the cleaved optical fiber can be collected by a waveguide etched on the surface of the cantilever 12 and routed to a desired location, such as the nanophotonic crystal 14.

The trapping of the photons in the holes in the ungapped region 16 of the photonic lattice can cause shifting (e.g., vibration and/or movement) in the photonic lattice due to light pressure thereby causing mechanical excitation. The photonic lattice can be coupled to a mechanical coupler 26 (e.g., a mechanical resonator), such as a piezoelectric actuator, a capacitor, etc. Accordingly, optical energy can be converted into mechanical energy. Equation 1 characterizes a coupling strength between the photonic lattice and the mechanical coupler 26.

$$g_{om} = \frac{\partial \omega_{LC}}{\partial x} n_d \sqrt{X_{ZP}} \qquad \text{Equation 1}$$

wherein:

$g_{om}$ is the coupling strength between the photonic lattice and the mechanical coupler;

$X_{ZP}$ is the zero point displacement of the mechanical coupler;

$\omega_{LC}$ is the resonant frequency (in radians) of the optical-microwave-quantum transducer, which can be about 10 to about 100 gigahertz (GHz);

x is the displacement of the photonic lattice and the mechanical coupler; and $n_d$ is the photon number quantifying the drive intensity.

In some examples, the mechanical coupler 26 can be coupled directly to the nanophotonic crystal 14 that includes the photonic lattice. In other examples, the cantilever 12 can include a buffer 28 (e.g., an intrinsic material, such as silicon) that can prevent leaking emitted photons from the photonic lattice from reaching the mechanical coupler 26 to further optically isolate the mechanical coupler 26 and the photonic lattice. Upon shifting of the photonic lattice, the mechanical coupler 26 can also shift (e.g., vibrate or move), which shifting of the mechanical coupler 26 can induce electrical modulation (such as a quantum pulse) (e.g., electromagnetic excitation) in a resonance circuit 30 of the coupled superconducting circuit 6. The resonance circuit 30 could be implemented, for example, as a superconducting microwave cavity, such as an LC resonator, a Josephson Junction, etc. Equations 2 and 3 can characterize a coupling strength between the mechanical coupler 26 and the resonance circuit 30 of the superconducting circuit 6.

$$g_{me} \approx \eta \sqrt{X_{ZP}} \qquad \text{Equation 2}$$

$$\eta = -\frac{\omega_{LC}}{2d} \qquad \text{Equation 3}$$

wherein:

$g_{me}$ is the coupling strength between the mechanical coupler and the resonance circuit of the superconducting circuit;

$\eta$ is the participation ratio of the capacitance of the mechanical coupler as compared to the capacitance of the resonance circuit of the superconducting circuit; and d is the distance between plates of the mechanical coupler, which can be up to about 10 nm.

By employing Equations 1-3, the cooperativity of the mechanical coupler 26 with the superconducting circuit 6 can be calculated with Equation 4. The cooperativity can characterize an effective contribution of the capacitive coupling to the mechanical motional to the overall capacitance of the resonance circuit 30 (e.g., a "cleanness" of resonance).

$$C_{op} = \frac{4g^2}{\Gamma \kappa} \qquad \text{Equation 4}$$

wherein:

$C_{op}$ is the cooperativity of the mechanical coupler with the superconducting circuit and the optical channel;

$\Gamma$ is the electrical decay rate (linewidth), which can be about 100 kilohertz (kHz);

g is the coupling strength between the mechanical coupler and the resonance circuit of the superconducting circuit ($g_{me}$); and $\kappa$ is the dissipation rate of the mechanical coupler.

Conversely, the mechanical coupler 26 can vibrate in response to an electrical pulse (e.g., a quantum pulse) propagated by the resonance circuit 30 of the superconducting circuit 6. Such vibration of the mechanical coupler 26 can induce photons in the ungapped region 18 of the photonic lattice. Such induced photons can induce a light pulse in the tapered optical fiber 10, which can be transmitted to the receiver 24 of the node 20. In this manner, optical communication can be established between the superconducting circuit 6 and the node 20, which node 20 can be external to the refrigeration unit 8.

By employing the optical-microwave-quantum transducer 2, transduction can operate at the single-photon, fully reversible level. The transduction can operate between microwave and optical photons, where the transduction is mediated by coupling to a common mechanical resonator (e.g., the cantilever 12). The microwave photons are excitations of the resonance circuit 30 of superconducting circuit 6 (e.g., a microwave cavity) and the optical photons are excitations of the nanophotonic crystal 14.

The optical-microwave-quantum transducer 2 can be considered to be a symmetric device. Accordingly, the optical-microwave-quantum transducer 2 can include coherent optical radiation carried by the optical fiber 4, the nanophotonic crystal 14, the mechanical coupler 26, the resonance circuit 30 of the superconducting circuit 6 and a superconducting transmission line of the superconducting circuit 6 that can carry coherent microwave radiation. The transduction can occur in the nanophotonic crystal 14, the mechanical coupler 26 and the resonance circuit 30. The cantilever 2 can operate to provide some spatial separations between these components of transduction so as to avoid corruption of the coherent microwave radiation by the coherent optical radiation and vice versa.

In this manner, the superconducting circuit 6 can communicate with the node 20 coupled to the optical channel 4. The node 20 can be implemented, for example, as another cantilever 12 coupled to another superconducting circuit 6 stored in another refrigeration unit 8. Accordingly, two superconducting circuits can communicate via the optical channel 4, such that the node 20 and the refrigeration unit 8 could be separated by several kilometers.

In other examples, the node 20 could be implemented to include an optical transceiver that can send and receive optical signals. In such a situation, the node 20 can include, for example, a (non-superconducting) circuit, such as a microprocessor, an optical hub (e.g., a repeater, a router, etc.). Accordingly, the node 20 can communicate with the superconducting circuit 6 via the optical channel 4.

Figure 2:
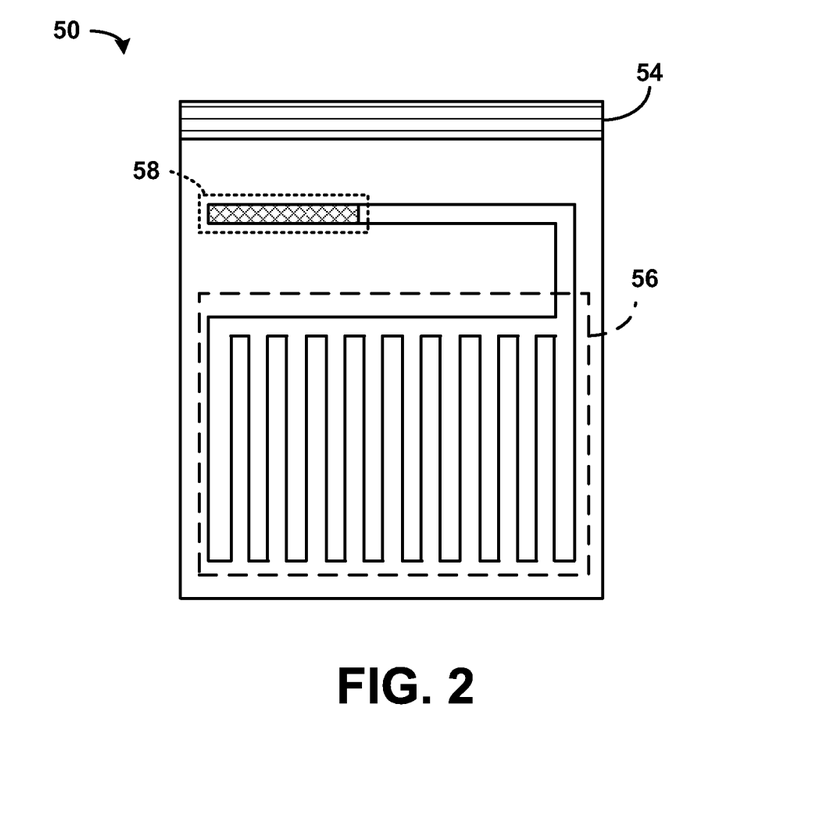
FIG. 2 illustrates an example of a superconducting circuit coupled to a mechanical coupler.

FIG. 2 illustrates an example of a superconducting circuit 50 that could be employed, for example as the superconducting circuit 6 illustrated in FIG. 1. The superconducting circuit 50 can be formed for example, from superconductive aluminum or other superconducting material. The superconducting circuit 50 can be stored in a refrigeration unit that can achieve temperatures from about 10 mK to about 30 mK. The superconducting circuit 50 can include a ground plane 54 that can be coupled to an electrically neutral node (e.g., ground). The superconducting circuit 50 can also include a resonance LC circuit 56.

The resonance LC circuit 56 can be formed from a trace patterned in the manner illustrated. The resonance LC circuit 56 can be implemented, for example, as a superconducting microwave cavity readout circuit. In other examples, the resonance LC circuit 56 can be formed with a Josephson Junction that operates in a manner similar to an LC circuit. Thus, in some examples, the superconducting circuit 50 can be implemented as a qubit, such as in a quantum computer. The resonance LC circuit 56 can be coupled to a cantilever 58, such as the cantilever 12 illustrated in FIG. 1. The cantilever 58 can convert optical signals into mechanical signals and the resultant mechanical signals can induce an electrical quantum that can be employed and processed by the superconducting circuit 50. Additionally, the cantilever 58 can convert electrical (quantum) signals propagated from the resonance LC circuit 56 (or Josephson Junction) into mechanical signals. In such an example, the resultant mechanical signals can induce an optical quantum on an optical channel that can be provided to another node (e.g., the node 20 illustrated in FIG. 1).

Figure 3:
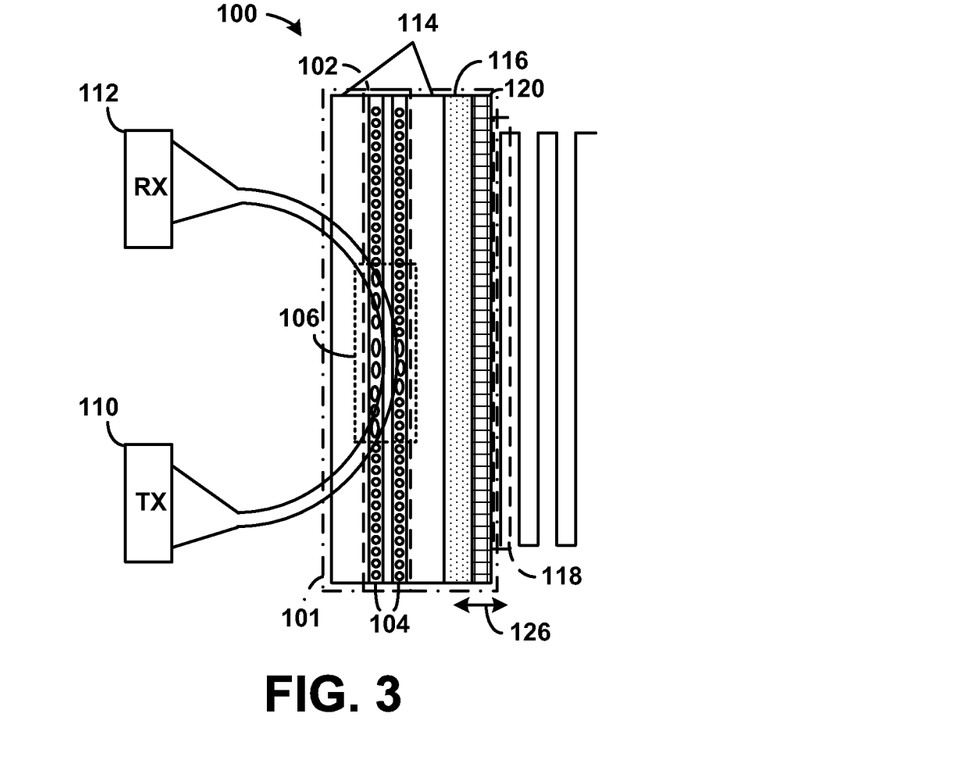
FIG. 3 illustrates an example of an optical-microwave-quantum transducer.
Figure 4:
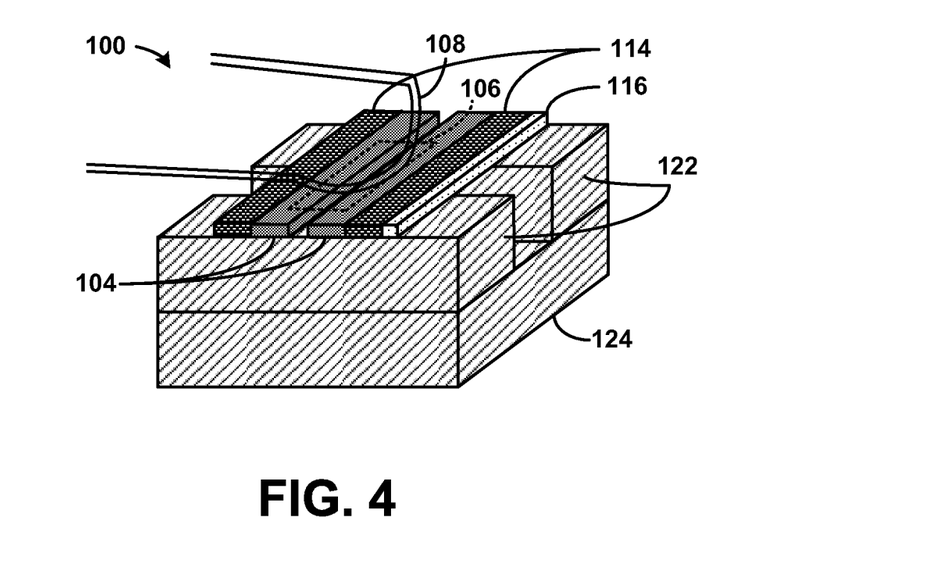
FIG. 4 illustrates a three-dimensional view of the optical-microwave-quantum transducer illustrated in FIG. 3.

FIG. 3 illustrates an example of an optical-microwave-quantum transducer 100 that could be employed to implement the optical-microwave-quantum transducer 2 illustrated in FIG. 1. The optical-microwave-quantum transducer 100 can include a cantilever 101 that could be employed, for example to implement the cantilever 2 of FIG. 1. FIG. 4 illustrates a three-dimensional view of the optical-microwave-quantum transducer 100 illustrated in FIG. 3. For purposes of simplification of explanation, the same reference numbers in FIGS. 3 and 4 are employed to denote the same structure. The optical-microwave-quantum transducer 100 can include a photonic lattice 102 that can be formed from two (one dimensional) parallel nanophotonic crystals 104, each with a single row of holes drilled or etched therein. The two parallel nanophotonic crystals 104 can be separated by a gap with a distance that can be employed to set the resonance frequency of the optical-microwave-quantum transducer 100 ($\omega_{LC}$ of Equation 1). The gap can be about 10 nm to about 100 nm wide. The photonic lattice 102 can be referred to as a "zipper cavity". The photonic lattice 102 can include a gapped region that does not trap emitted photons and an ungapped region 106 that does trap emitted photons.

A tapered optical fiber 108 can overlay at least a portion of the ungapped region 106 in the manner described. The tapered optical fiber 108 can include a transmitter 110 that can emit light and a receiver 112 that can receive light 112. The transmitter 110 and the receiver 112 can be stored in an area that is external to the refrigeration unit that stores the optical-microwave-quantum transducer 100. Propagation of light transmitted by the transmitter 110 can cause photons to be released at or near the ungapped region 106 of the photonic lattice 102 via the tapered optical fiber 108. By implementing the photonic lattice 102 with the "zipper cavity", the tapered optical fiber 108 can be efficiently coupled to the photonic lattice 102. Moreover, the "zipper cavity" geometry provides for high quality optical modes (Q_o) and high quality mechanical modes (Q_m) to be coupled.

Each of the nanophotonic crystals 104 can be coupled to a buffer 114, which can be formed from a material with a lower index of refraction that the nanophotonic crystal 104, such as silicon (e.g., n=1.5), such that the nanophotonic crystals 104 can retain a condition of total internal reflection. The buffer 114 can also be coupled to a superconducting material 116, such as super conducting aluminum. The superconducting material can form a first plate 116 of a coupling capacitor. The coupling capacitor could be employed, for example, to implement the mechanical coupler 26 of FIG. 1. A second plate 118 of the coupling capacitor can be formed on a superconducting circuit. In some examples, the first plate 116 and the second plate 118 of the coupling capacitor can be separated by a dielectric 120. In other examples, the first plate 116 and the second plate 118 of the capacitor can be separated by an (air) gap. The capacitance of the coupling capacitor can be defined by Equation 5.

$$C = \varepsilon_0 \frac{A}{d} \quad \text{Equation 5}$$

wherein:

C is the capacitance of the coupling capacitor formed between the mechanical coupler and the superconducting circuit;

$\varepsilon_0$ is the permittivity of free space;

d is the distance between the first plate and the second plate of the coupling capacitor; and A is the area of area of the first plate of the coupling capacitor, which can be about 100,000 nm$^2$ (100 nm×1000 nm).

The photonic lattice 102, the buffer 114 and the first plate 116 of the coupling capacitor can overlay a pair of parallel beams 122 separated by a gap, which parallel beams 122 can be formed, for example, from $Si_3N_4$. The pair of parallel beams 122 can overlay a plate 124 that can also be formed from $Si_3N_4$. The gap between the parallel beams 122 can confine the optical signals propagating though the tapered optical fiber 108 in the gapped region of the photonic lattice 102.

The tapered optical fiber 108 can generate an evanescent field at the ungapped region 106 of the photonic lattice 102. Photons emitted by the tapered optical fiber 108 can be trapped in the ungapped region 106 of the photonic lattice 102. In this manner, electromagnetic modes (e.g., excitation) can be either within the parallel beams 122 or between the parallel beams 122. Such a trapping can cause the photonic lattice 102 to vibrate (e.g., mechanically excite), such that the optical energy from the photons is converted into mechanical energy. Vibration of the photonic lattice 102 can cause the first plate 116 of the capacitor to vibrate as well, such as in the direction indicated by the arrows at 126. Vibrations of the first plate 116 of the capacitor can induce an electrical pulse on the superconducting circuit, such that mechanical energy can be converted into electrical energy.

In reverse, an electrical pulse propagating on the superconducting circuit can cause vibration of the first plate 116 of the capacitor in the mechanical coupler, thereby converting electrical energy into mechanical energy. Moreover, vibration of the first plate 116 of the capacitor can induce photons in the ungapped region 106 of the photonic lattice 102, which induced photons can induce an optical pulse on the tapered optical fiber 108, thereby converting mechanical energy into optical energy.

Figure 5:
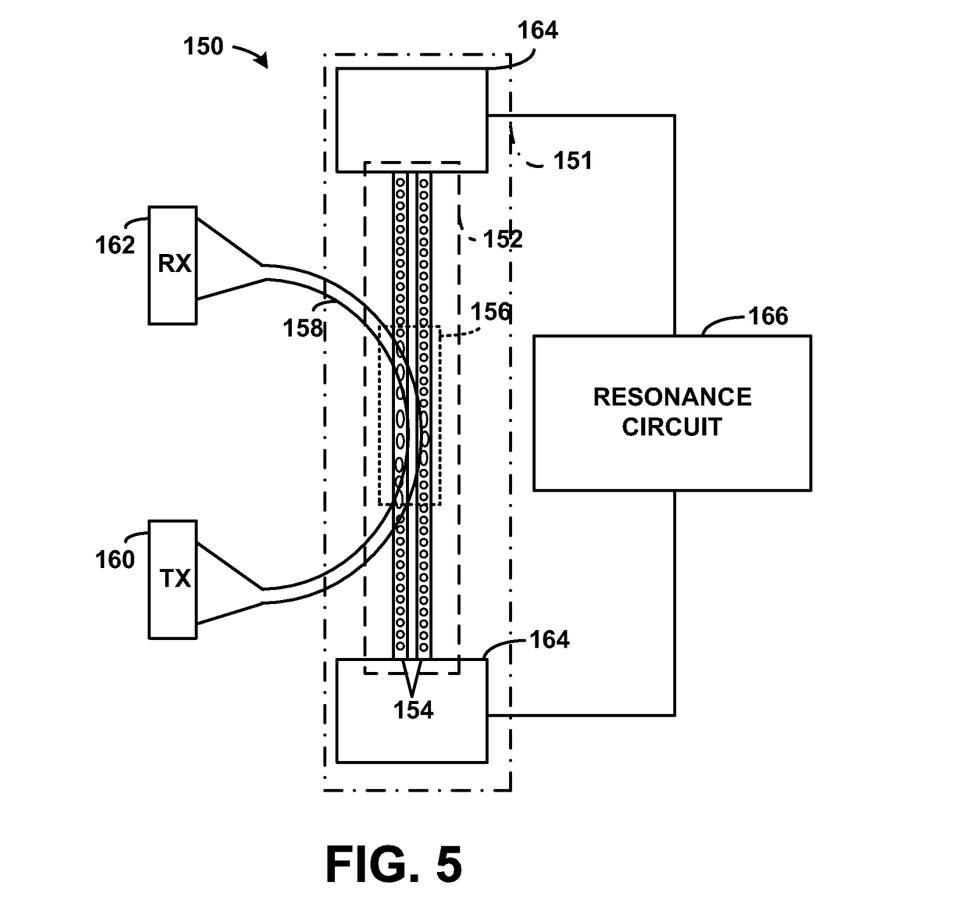
FIG. 5 illustrates another example of an optical-microwave-quantum transducer.

FIG. 5 illustrates another example of an optical-microwave-quantum transducer 150 that could be employed to implement the optical-microwave-quantum transducer 2 illustrated in FIG. 1. The optical-microwave-quantum transducer 150 can include a cantilever 151 that could be employed, for example to implement the cantilever 12 of FIG. 1. The optical-microwave-quantum transducer 150 can include a photonic lattice 152 that can be formed from two (one dimensional) parallel nanophotonic crystals 154, each with a single row of holes drilled or etched therein (a zipper cavity). The two parallel nanophotonic crystals 154 can be separated by a gap with a distance that can be employed to set the resonant frequency of the optical-microwave-quantum transducer 150 ($\omega_{LC}$ of Equation 1). The photonic lattice 152 can include a gapped region that does not trap emitted photons and an ungapped region 156 that does trap emitted photons.

A tapered optical fiber 158 can overlay at least a portion of the ungapped region 156 in the manner described. The tapered optical fiber 158 can be coupled to a transmitter 160 that can emit light and a receiver 162 that can receive light. The transmitter 160 and the receiver 162 can be stored in an area that is external to the refrigeration unit that stores the optical-microwave-quantum transducer 150. Propagation of light transmitted by the transmitter 160 can cause photons to be released at or near the ungapped region 156 of the photonic lattice 152. By implementing the photonic lattice 152 with the "zipper cavity", the tapered optical fiber 158 can be efficiently coupled to the photonic lattice 152. Moreover, the "zipper cavity" geometry provides for high quality optical modes (Q_o) and high quality mechanical modes (Q_m) to be coupled.

Each of the nanophotonic crystals 154 can be coupled to a pair of piezoelectric actuators 164 that could be formed, for example from a crystal or piezoelectric ceramic material. The piezoelectric actuators 164 can be coupled to opposing ends of the pair of nanophotonic crystals 154. The piezoelectric actuators 164 can be employed, for example, to implement the mechanical coupler 26 of FIG. 1. The piezoelectric actuators 164 can be coupled to a resonance circuit 166 of a superconducting circuit (e.g., the resonance circuit 30 of FIG. 1).

The tapered optical fiber 158 can generate an evanescent field at the ungapped region 156 of the photonic lattice 152. Photons emitted by the tapered optical fiber 158 can be trapped in the ungapped region 156 of the photonic lattice 152. In this manner, electromagnetic modes (e.g., excitation) can be either within the pair of nanophotonic crystals 154 or between the pair of nanophotonic crystals 154. Such a trapping can cause the photonic lattice 152 to vibrate (e.g., mechanically excite), such that the optical energy from the photons is converted into mechanical energy. Vibration of the photonic lattice 152 can cause the mechanical pressure in the piezoelectric actuators 164, which can induce a voltage on the resonance circuit 166, such that mechanical energy can be converted into electrical energy.

In reverse, an electrical (e.g., quantum) pulse propagating on the resonance circuit 166 induces a voltage on the piezoelectric actuators 164 that can cause the piezoelectric actuators 164 to induce mechanical pressure on the photonic lattice 152, thereby converting electrical energy into mechanical energy. Moreover, the mechanical pressure of the piezoelectric actuators 164 can cause the photonic lattice 152 to vibrate, thereby inducing photons in the ungapped region 156 of the photonic lattice 152, which induced photons can induce an optical pulse on the tapered optical fiber 158, thereby converting mechanical energy into optical energy. In this manner, the cantilever 151 can operate as a mediator of electromechanical coupling by the piezoelectric effect. Thus, in the optical-microwave-quantum transducer 150 coupling can occur inside the material of cantilever 151 via the piezoelectric effect, as opposed to coupling occurring at capacitor plate and/or an inductive loop, such as illustrated and described with respect to FIG. 3.

Figure 6:
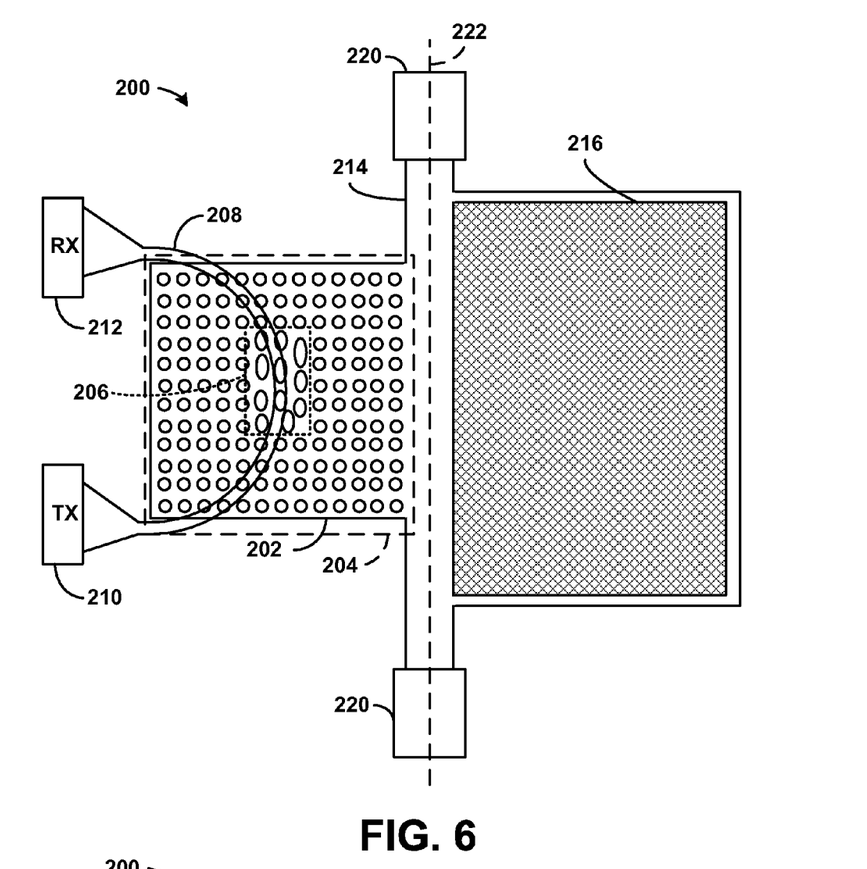
FIG. 6 illustrates yet another example of an optical-microwave-quantum transducer.
Figure 7:
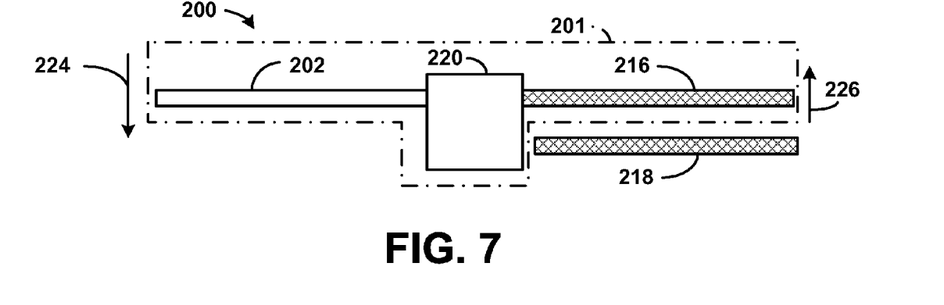
FIG. 7 illustrates a side view of the optical-microwave-quantum transducer illustrated in FIG. 6.

FIG. 6 illustrates an example of an optical-microwave-quantum transducer 200 that could be employed, for example to implement the optical-microwave-quantum transducer 2 of FIG. 1. FIG. 7 illustrates a side view of the optical-microwave-quantum transducer 200 of FIG. 6 that illustrates a cantilever 201 that could be employed to implement the cantilever 12 of FIG. 1. For purposes of simplification of explanation, the same reference numbers are employed in FIGS. 6 and 7 to denote the same structure. The optical-microwave-quantum transducer 200 can include a nanophotonic crystal 202 that includes a plate with a photonic lattice 204 that can include a plurality of rows of holes (e.g., about 10 or more) that can be drilled or etched therein. The photonic lattice 204 can include a gapped region that does not trap emitted photons and an ungapped region 206 that does trap emitted photons.

A tapered optical fiber 208 can overlay at least a portion of the ungapped region 206 in the manner described. The optical fiber including the tapered optical fiber 208 can be coupled to a transmitter 210 that can emit light and a receiver 212 that can receive light. The transmitter 210 and the receiver 212 can be stored in an area that is external to the refrigeration unit that stores the optical-microwave-quantum transducer 200. Propagation of light transmitted by the transmitter 210 can cause photons to be released at or near the ungapped region 206 of the photonic lattice 204.

The photonic lattice 204 can be coupled to a substrate 214 of a first plate 216 of a vacuum gap capacitor. The vacuum gap capacitor can be employed, for example, to implement the mechanical coupler 26 of FIG. 1. The substrate 214 can be formed of an intrinsic material, such as silicon (Si) and can include a region that can circumscribe flexible superconducting material, such as superconducting aluminum, which can be implemented as the first plate 216 of the vacuum gap capacitor. The first plate 216 of the vacuum gap capacitor can overlay a second plate 218 of the vacuum gap capacitor that can be integrated with a superconducting circuit (e.g., the superconducting circuit 6 illustrated in FIG. 1. The second plate 218 of the vacuum gap capacitor can also be formed of a superconducting material, such as superconducting aluminum. The first plate 216 and the second plate 218 of the vacuum gap capacitor can be separated by a vacuum gap. The capacitance of the vacuum gap capacitor can be defined by Equation 6.

$$C = \varepsilon_0 \frac{A}{d} \qquad \text{Equation 6}$$

wherein

C is the capacitance of the vacuum gap capacitor;

$\varepsilon_0$ is the permittivity of free space;

d is the distance between the first plate and the second plate of the vacuum gap capacitor; and A is the area of the first plate of the vacuum gap capacitor, which can be about 100 μm² (100 μm×100 μm).

The substrate 214 of the vacuum gap capacitor can be tethered to anchors 220 (e.g., posts) that can allow twisting of the vacuum gap capacitor and the photonic lattice 204 about an axis of rotation 222. For example, the tapered optical fiber 208 can generate an evanescent field at the ungapped region 206 of the photonic lattice 204. Photons emitted by the tapered optical fiber can be trapped in the ungapped region 206 of the photonic lattice 204. Such a trapping can cause the photonic lattice 204 to move in the direction indicated by the arrow 224, which, in response, can cause the first plate 216 of the vacuum gap capacitor to move in an opposing direction indicated by the arrow 226, such that the optical energy from the photons is converted into mechanical energy. Upon reduction of photons emitted at the ungapped region 206 of the photonic lattice 204, the original position of the photonic lattice 204 and the first plate 216 of the vacuum gap capacitor can be restored. In this manner, the optical-microwave-quantum transducer 200 can operate as a torsional oscillator (e.g., a "seesaw"). The amount of torque inducted by the optical-microwave-quantum transducer 200 can be characterized with Equation 7.

$$\tau \approx A_{fp} l \frac{1}{2} \varepsilon_0 |E|^2 \qquad \text{Equation 7}$$

wherein:

$\tau$ is the torque induced by the optical-microwave-quantum transducer;

$A_{fp}$ is the vacuum gap foot print (area), which can be about 10,000 nm²;

l is the distance of the ungapped region of the photonic lattice to the axis of rotation;

$\varepsilon_0$ is the permittivity of free space; and

E is the electric field strength at the ungapped region of the photonic lattice.

Movement of the first plate 216 of the vacuum gap capacitor relative to the second vacuum gap capacitor can induce an electrical pulse (e.g., a quantum pulse) on the second plate of the vacuum gap capacitor which can be propagated to the resonance circuit of the superconducting circuit, thereby converting mechanical energy into electrical energy. In some examples, the first plate 216 and the nanophotonic crystal 202 can remain rigid as the first plate 216 and the nanophotonic crystal 202 twist about the axis 222.

In reverse, an electrical (e.g., quantum) pulse propagating on the superconducting circuit can cause movement of the first plate 216 of the vacuum gap capacitor in the direction indicated by the arrow 226, which, in response can cause movement of the photonic lattice 204 in the opposite direction indicated by the arrow 224, thereby converting electrical energy into mechanical energy. Moreover, movement of the photonic lattice 204 can induce an optical pulse on the tapered optical fiber, thereby converting mechanical energy into optical energy. In the optical-microwave-quantum transducer 200 illustrated in FIGS. 6 and 7, a relatively high participation ratio and high cooperativity can be achieved since the first plate 216 and the second plate 218 of the vacuum gap capacitor can be relatively large, thereby achieving a relatively high capacitance, which can correspond to a large electromechanical coupling. Moreover, the high participation ratio can make the optical-microwave-quantum transducer 200 less susceptible to quasiparticle noise.

By implementing the optical-microwave-quantum transducer 200 in this manner, a two-dimensional dielectric (e.g., the first plate 216) can be suspended. Additionally, the optical-microwave-quantum transducer 200 can implement a torsional mechanical mode (e.g., excitation) that can have superior mechanical quality factors ($Q\_o$).

Figure 8:
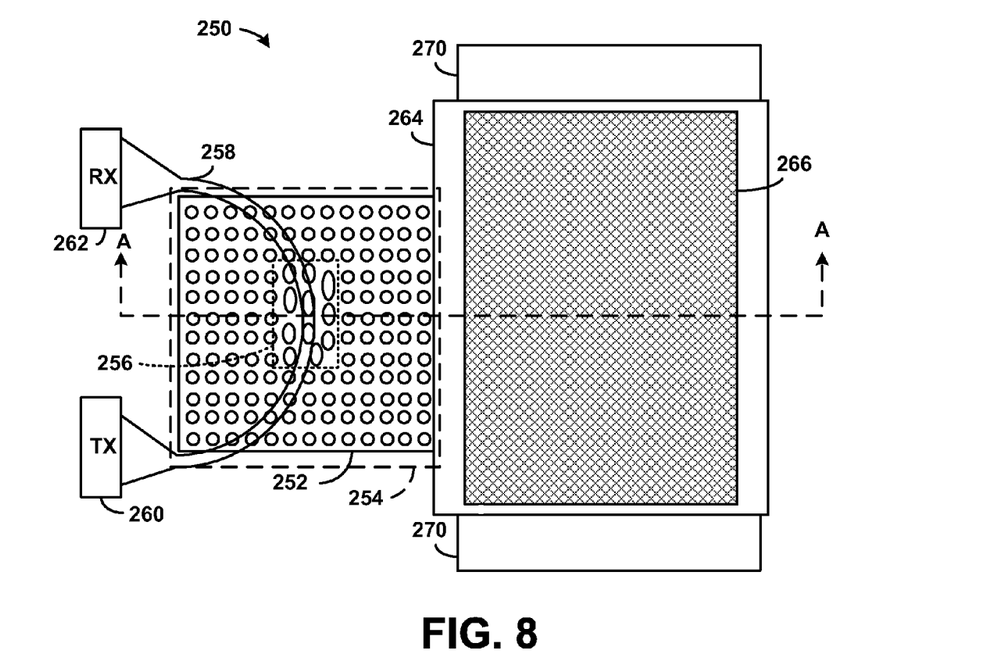
FIG. 8 illustrates yet another example of an optical-microwave-quantum transducer.
Figure 9:
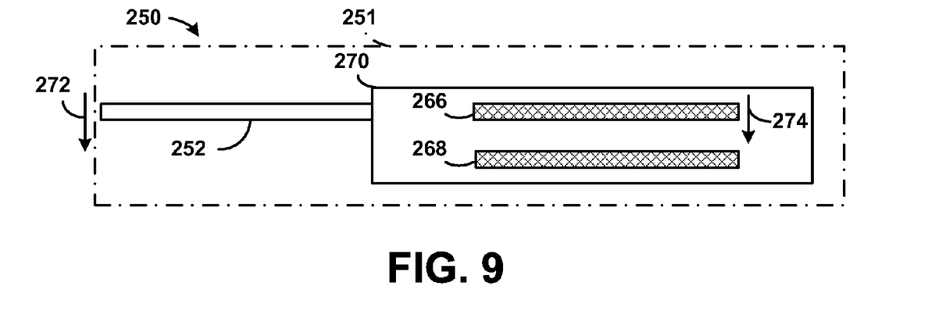
FIG. 9 illustrates a cross sectional view of the optical quantum transducer illustrated in FIG. 8.

FIG. 8 illustrates an example of an optical-microwave-quantum transducer 250 that could be employed, for example to implement the cantilever 12 of FIG. 1. FIG. 9 illustrates a cross sectional view of the optical-microwave-quantum transducer 250 of FIG. 7 taken along lines A-A that includes a cantilever 251 that could be employed to implement the cantilever 12 of FIG. 1. For purposes of simplification of explanation, the same reference numbers are employed in FIGS. 7 and 8 to denote the same structure. The optical-microwave-quantum transducer 250 can include a nanophotonic crystal 252 that includes a plate with a photonic lattice 254 that can include a plurality of rows of holes (e.g., about 10 or more) that can be drilled or etched therein. The photonic lattice 254 can include a gapped region that does not trap emitted photons and an ungapped region 256 that does trap emitted photons.

A tapered optical fiber 258 can overlay at least a portion of the ungapped region 256 in the manner described. An optical fiber that includes the tapered optical fiber 258 can include a transmitter 260 that can emit light and a receiver 262 that can receive light. The transmitter 260 and the receiver 262 can be stored in an area that is external to the refrigeration unit that stores the optical-microwave-quantum transducer 250. Propagation of light transmitted by the transmitter 260 can cause photons to be released at or near the ungapped region 256 of the photonic lattice 254.

The photonic lattice 254 can be coupled to a substrate 264 of a first plate 266 of a vacuum gap capacitor. The vacuum gap capacitor can be employed, for example, to implement the mechanical coupler 26 of FIG. 1. The substrate 264 can be formed of Si and can include a region that can circumscribe superconducting material, such as flexible superconducting aluminum, which can be implemented as the first plate 266 of the vacuum gap capacitor. The first plate 266 of the vacuum gap capacitor can overlay a second plate 268 of the vacuum gap capacitor that can be integrated with a superconducting circuit (e.g., the superconducting circuit 6 illustrated in FIG. 1. The second plate 268 of the vacuum gap capacitor can also be formed of a superconducting material, such as superconducting aluminum. The first plate 266 and the second plate 268 of the vacuum gap capacitor can be separated by a vacuum gap. The capacitance of the vacuum gap capacitor can be defined by Equation 6.

The substrate 264 of the vacuum gap capacitor can be tethered to rails 270 that extend along an edge of the substrate 264 and allow a center region of the first plate 266 of the vacuum gap capacitor to move relative to the second plate 268 of the vacuum gap capacitor. For example, the tapered optical fiber 258 can generate an evanescent field at the ungapped region 256 of the photonic lattice 254. Photons emitted by the tapered optical fiber 258 can be trapped in the ungapped region 256 of the photonic lattice 254. Such a trapping can cause the photonic lattice 254 to move in the direction indicated by the arrow 272, which, in response, can cause the first plate 266 of the vacuum gap capacitor to move in the (same) direction indicated by the arrow 274, such that the optical energy from the photons is converted into mechanical energy. Upon reduction of photons emitted at the ungapped region 256 of the photonic lattice 254, the original position of the photonic lattice 254 and the first plate 266 of the vacuum gap capacitor can be restored. In this manner, the optical-microwave-quantum transducer 250 can operate as a drum oscillator. Movement of the first plate 266 of the vacuum gap capacitor relative to the second vacuum gap capacitor can induce an electrical pulse (e.g., a quantum pulse) on the second plate 268 of the vacuum gap capacitor which can be propagated to the resonance circuit of the superconducting circuit, thereby converting mechanical energy into electrical energy. By implementing the optical-microwave-quantum transducer 250 in this manner, a two-dimensional dielectric (e.g., the first plate 266) can be suspended.

In reverse, an electrical (e.g., quantum) pulse propagating on the superconducting circuit can cause movement of the first plate 266 of the vacuum gap capacitor in the direction indicated by the arrow 272, which, in response can cause movement of the photonic lattice 254 in the direction indicated by the arrow 274, thereby converting electrical energy into mechanical energy. Moreover, movement of the photonic lattice 254 can induce an optical pulse on the tapered optical fiber 258, thereby converting mechanical energy into optical energy.

In the optical-microwave-quantum transducer 250 illustrated in FIGS. 8 and 9, a relatively high participation ratio and high cooperativity can be achieved since the first and second plate 268 of the vacuum gap capacitor can be relatively large, such that the capacitance of the vacuum gap capacitor can be relatively large. Additionally, by securing the edges of the substrate 264 with rails 270, a relatively accurate capacitance of the vacuum gap capacitor can be achieved. Moreover, the high participation ratio can make the optical-microwave-quantum transducer 250 less susceptible to quasiparticle noise.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. An optical-microwave-quantum transducer comprising:
   a tapered optical fiber configured to transmit and receive optical signals; and
   a cantilever comprising:
      an optical cavity that includes a nanophotonic crystal, the optical cavity being configured to provide mechanical excitation in response to electromagnetic excitation induced by photons emitted from the tapered optical fiber; and
      a mechanical coupler being configured to induce electrical modulation onto a superconducting cavity in response to the mechanical excitation and to provide mechanical excitation in response to electromagnetic excitation induced by photons from the superconducting cavity, wherein the optical cavity is further configured to provide electromagnetic excitation that induces optical modulation on the tapered optical fiber in response to the mechanical excitation.

2. The optical-microwave-quantum transducer of claim 1, wherein the optical cavity comprises a pair of nanophotonic crystals arranged in parallel and separated by a gap, wherein each of the pair of nanophotonic crystals has a row of holes.

3. The optical-microwave-quantum transducer of claim 2, further comprising a buffer coupled between a given one of the pair of nanophotonic crystals and the mechanical coupler.

4. The optical-microwave-quantum transducer of claim 3, wherein the mechanical coupler comprises a capacitor with a first plate coupled to the buffer and a second plate coupled to the superconducting cavity.

5. The optical-microwave-quantum transducer of claim 4, wherein the optical cavity is configured to vibrate in response to trapping the photons emitted from the tapered optical fiber.

6. The optical-microwave-quantum transducer of claim 5, wherein the first plate of the capacitor vibrates in response to vibrations of the optical cavity, and wherein vibration of the first plate of the capacitor induces the electrical modulation on the second plate of the capacitor.

7. The optical-microwave-quantum transducer of claim 2, wherein the mechanical coupler comprises a piezoelectric actuator coupled to the pair of nanophotonic crystals and to the superconducting cavity.

8. The optical-microwave-quantum transducer of claim 7, wherein the optical cavity is configured to apply a pressure to the piezoelectric actuator in response to trapping the photons emitted from the tapered optical fiber.

9. The optical-microwave-quantum transducer of claim 8, wherein the piezoelectric actuator is configured to induce a voltage onto the superconducting cavity in response to the pressure applied to the piezoelectric actuator.

10. The optical-microwave-quantum transducer of claim 1, wherein optical cavity comprises a two-dimensional photonic lattice that comprises at least 10 rows of holes, and the nanophotonic crystal comprises a plate, and the plate is coupled to a substrate of the mechanical coupler.

11. The optical-microwave-quantum transducer of claim 10, wherein the mechanical coupler comprises a vacuum gap capacitor comprising:
   a first plate circumscribed by the substrate; and
   a second plate separated from the first plate by a vacuum gap, the second plate being electrically coupled to the superconducting cavity.

12. The optical-microwave-quantum transducer of claim 11, wherein the mechanical coupler further comprises a set of anchors tethered to the substrate, wherein the set of anchors are configured to allow a twisting of the photonic lattice and the first plate of the vacuum gap capacitor about an axis of rotation.

13. The optical-microwave-quantum transducer of claim 12, wherein photons trapped in the photonic lattice cause the photonic lattice to shift in a first direction, thereby causing the first plate of the vacuum gap capacitor to shift in a second direction, opposite the first direction about the axis of rotation.

14. The optical-microwave-quantum transducer of claim 13, wherein shifting of the first plate of the vacuum gap capacitor causes the second plate of the vacuum gap capacitor to induce the electrical modulation onto the superconducting cavity.

15. The optical-microwave-quantum transducer of claim 11, wherein the mechanical coupler further comprises a set of rails tethered along opposing edges of the substrate, wherein the set of rails are configured to allow shifting of a center region of the photonic lattice and the first plate of the capacitor.

16. The optical-microwave-quantum transducer of claim 15, wherein photons trapped in the photonic lattice cause the photonic lattice to shift in a given direction, thereby causing the first plate of the vacuum gap capacitor to shift in the given direction.

17. An optical-microwave-quantum transducer comprising:
   a cantilever comprising
      a mechanical coupler that is electrically coupled to a superconducting cavity, the mechanical coupler being configured to mechanically excite in response to an electrical pulse induced by photons emitted from the superconducting cavity on the mechanical coupler; and
      an optical cavity having at least two rows of holes formed in a nanophotonic crystal and being mechanically coupled to the mechanical coupler, wherein a given hole in the nanophotonic crystal has an axis that extends through a center of the given hole and intersects with a tapered optical fiber, wherein the optical cavity is configured to induce optical modulation on the tapered optical fiber in response to the mechanical excitation of the mechanical coupler.

18. The optical-microwave-quantum transducer of claim 17, wherein the optical cavity comprises a pair of nanophotonic crystals arranged in parallel and separated by a gap, wherein each of the pair of nanophotonic crystals has a row of the at least two rows of holes.

19. The optical-microwave-quantum transducer of claim 18, wherein the optical cavity includes a photonic lattice and the at least two rows of holes comprises at least 10 rows of holes, and the nanophotonic crystal comprises a plate, and the plate is coupled to a substrate of the mechanical coupler, wherein the mechanical coupler comprises a vacuum gap capacitor comprising:
   a first plate circumscribed by the substrate; and
   a second plate separated from the first plate by a vacuum gap, the second plate being electrically coupled to a resonance circuit of the superconducting circuit.

20. A system comprising:
   a refrigeration unit that stores an optical-microwave-quantum transducer at superconducting temperatures, the optical-microwave-quantum transducer comprising:
      a node configured to transmit and receive optical pulses on an optical channel comprising an optical fiber, wherein the node is external to the refrigeration unit; and a cantilever comprising:
- an optical cavity that includes a nanophotonic crystal, the optical cavity being configured to provide mechanical excitation in response to electromagnetic excitation induced by photons emitted from the optical fiber; and
- a mechanical coupler being configured to induce electrical modulation onto a superconducting cavity in response to the mechanical excitation and to provide mechanical excitation in response to electromagnetic excitation induced by photons from the superconducting cavity, wherein the optical cavity is further configured to provide electromagnetic excitation that induces optical modulation on the optical fiber in response to the mechanical excitation.

21. The system of claim 20, wherein the node comprises another refrigeration unit that stores another optical-quantum transducer at superconducting temperatures.

* * * * *